(12) United States Patent
Pauls et al.

(10) Patent No.: US 10,551,747 B2
(45) Date of Patent: Feb. 4, 2020

(54) DEVICE FOR CHANGING A SURFACE SHAPE OF AN OPTICAL ELEMENT VIA ELECTRON IRRADIATION

(71) Applicant: Carl Zeiss SMT GmbH, Oberkochen (DE)

(72) Inventors: Walter Pauls, Huettlingen (DE); Florian Ahles, Aalen (DE); Martin Weiser, Sinsheim (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 16/117,851

(22) Filed: Aug. 30, 2018

(65) Prior Publication Data

US 2019/0018324 A1 Jan. 17, 2019

Related U.S. Application Data

(63) Continuation of application No. PCT/EP2017/000255, filed on Feb. 23, 2017.

(30) Foreign Application Priority Data

Mar. 4, 2016 (DE) .................. 10 2016 203 591

(51) Int. Cl.
*G03F 7/20* (2006.01)
*G02B 1/12* (2006.01)
*G02B 5/08* (2006.01)

(52) U.S. Cl.
CPC .......... *G03F 7/70316* (2013.01); *G02B 1/12* (2013.01); *G02B 5/0891* (2013.01);
(Continued)

(58) Field of Classification Search
None
See application file for complete search history.

(56) References Cited

U.S. PATENT DOCUMENTS

| 2001/0011465 A1 | 8/2001 | Seward, III |
| 2012/0212721 A1* | 8/2012 | Clauss ..................... G02B 1/12 355/67 |
| 2014/0307308 A1 | 10/2014 | Weiss et al. |

FOREIGN PATENT DOCUMENTS

| DE | 41 08 404 A1 | 10/1991 |
| DE | 195 24 391 A1 | 1/1996 |
| DE | 10 2005 017 632 A1 | 10/2006 |
| DE | 10 2006 032 303 A1 | 1/2008 |
| DE | 10 2011 084 117 A1 | 4/2013 |

(Continued)

OTHER PUBLICATIONS

International Preliminary Report on Patentability for corresponding PCT Appl No. PCT/EP2017/000255, dated Sep. 4, 2018.

(Continued)

*Primary Examiner* — Michael J Logie
(74) *Attorney, Agent, or Firm* — Fish & Richardson P.C.

(57) ABSTRACT

The disclosure relates to a device for changing a shape of a surface of an optical element via electron irradiation. The device includes an electron irradiation unit for radiating electrons onto the surface with a locally resolved energy dose distribution for the purpose of producing local material densifications in the optical element. Furthermore, the device includes a control unit for determining a locally resolved energy dose distribution from a predefined desired change of a surface shape of the optical element by optimization via a minimization of a merit function, in such a way that a difference between the desired change and an actual change of the surface shape of the optical element, the actual change being brought about on account of the predefinition determined, is minimized.

20 Claims, 3 Drawing Sheets

(52) U.S. Cl.
CPC ...... *G03F 7/70033* (2013.01); *G03F 7/70266* (2013.01); *G03F 7/70308* (2013.01); *G03F 7/70616* (2013.01); *G03F 7/70958* (2013.01)

(56) References Cited

FOREIGN PATENT DOCUMENTS

| | | |
|---|---|---|
| DE | 10 2012 212 199 A1 | 6/2013 |
| DE | 10 2015 223 795 A1 | 1/2016 |
| WO | WO 2011/020655 A1 | 2/2011 |

OTHER PUBLICATIONS

German Office Action, with translation thereof, for corresponding DE Appl No. 10 2016 203 591.6, dated Jun. 9, 2016.

Dai, Guang-ming; Mahajan, Virendra N., "Nonrecursive determination of orthonormal polynomials with matrix formulation," Optics Letters, vol. 32, No. 1, 2007.

M. Xu et al., "Structure optimization and fabricating capability analysis of an ion-beam machine for a subnanometer optical surface," Applied Optics 54 (2015), 8055-8061.

M. Zeuner et al., "Ion beam figuring technology in optics manufacturing," Optik & Photonik 7 (2012), 56-58.

S. Naik, "Optimization of process planning for focused ion beam machine in nano-manufacturing," 2012, Masters Theses, Paper 5287.

Machine translation of Ehlich, H; Zeller, K, "Cebysev-Polynome in mehreren Veranderlichen," Mathematische Zeitschrift, vol. 93, pp. 142-143, 1996 / Ehlich et al., "Cebysev—polynomials in several variables," Math. 93, 142-143 (1966).

International Search Report for corresponding PCT Appl No. PCT/EP2017/000255, dated Jun. 8, 2017.

* cited by examiner

DEVICE FOR CHANGING A SURFACE SHAPE OF AN OPTICAL ELEMENT VIA ELECTRON IRRADIATION

CROSS-REFERENCE TO RELATED APPLICATION

The present application is a continuation of, and claims benefit under 35 USC 120 to, international application PCT/EP2017/000255, filed Feb. 23, 2017, which claims benefit under 35 USC 119 of German Application No. 10 2016 203 591.6, filed Mar. 4, 2016. The entire disclosure of these applications are incorporated by reference herein.

FIELD

The disclosure relates to a device and a method for changing a shape of a surface of an optical element via electron irradiation. Furthermore, the disclosure relates to a projection lens for microlithography and also an inspection unit for inspecting a substrate for microlithography, such as, for instance, a reticle inspection unit or a wafer inspection unit, in each case including an optical element produced via the abovementioned method.

BACKGROUND

It is known that a material densification can occur in the case of amorphous materials as a result of irradiation with electrons. In this regard, a method exists in which electron bonds in the vicinity of the surface are redistributed as a result of the energy input of the electron beam, as a result of which a compaction of the material occurs. This effect can be used for processing optical elements.

By way of example, WO 2011/020 655 A1 describes a homogeneous compaction of the entire surface of a substrate for a mirror or of a substrate already provided with a reflective coating, by irradiation with electrons. The homogeneous densification in the vicinity of the surface brings about a uniform recess of the surface without a significant change of the optical surface shape. This measure makes it possible to prevent a further compaction in partial regions of the mirror by high-energy radiation during a use, for example in a projection lens for microlithography with EUV radiation (radiation in the extreme ultraviolet wavelength range).

DE 10 2012 212 199 A1 furthermore discloses a surface structuring of micro- or nanostructured components composed of glass or ceramic via electron irradiation. To that end, an electron beam having a diameter in the region of the smallest structures to be produced can be directed onto selected partial regions of the surface in order to achieve a local densification and thus a local depression of the surface corresponding to the desired surface structuring. Furthermore, a description is given of processing of an optical element of a projection exposure apparatus for microlithography with an electron beam. Imaging aberrations of the projection exposure apparatus that are caused by aging effects can be compensated for by a suitably implemented densification and an attendant change of the shape of the optical surface of the optical element.

In order to control the electron irradiation, it is conventional practice firstly to determine an energy dose distribution which is to be introduced into the optical element by the irradiation and which is suitable to bring about a desired correction of the surface shape of the optical element on account of material densifications brought about thereby. In accordance with the known information, the energy dose distribution is determined by a simulation of the effect of the incident energy dose distribution on a change of the surface shape. The simulation is based on an assumed linear relationship between a local compaction brought about by the electron irradiation and a surface recess of the optical element that is brought about thereby.

One issue during the processing of surfaces of optical elements by electron irradiation is that the actually achieved shape correction of the surface deviates from the desired shape correction—brought about for example by deformation of the optical element on account of material stresses introduced. This deviation poses problems in particular on account of narrow tolerance predefinitions during the correction of mirror elements of projection exposure apparatuses for EUV lithography.

SUMMARY

The disclosure seeks to provide a device and a method with which a predefined desired change of a surface shape of an optical element can be realized with high accuracy via electron irradiation.

In one aspect, the disclosure provides a device for changing a shape of a surface of an optical element via electron irradiation, wherein the device includes: an electron irradiation unit configured to radiate electrons onto the surface with a locally resolved energy dose distribution for the purpose of producing local material densifications in the optical element, and a control unit configured to determine, from a predefined desired change of a surface shape of the optical element, a predefinition for the locally resolved energy dose distribution for controlling the electron irradiation unit by optimization via a minimization of a merit function which involves seeking a variable or an argument with which the merit function has a minimum value. In this case, the predefinition for the locally resolved energy dose distribution is determined in such a way that a difference between the desired change and an actual change of the surface shape of the optical element, the actual change being brought about on account of the predefinition determined, is minimized. The merit function contains a conversion term for converting a local compaction, which describes a material densification in the region of an area element of the surface, into a resulting change of shape of the surface of the optical element. In this case, the conversion term is configured to take into account both a surface depression caused by the local compaction in the region of the area element and a deformation of at least one section of the surface whose area is a multiple of the area of the area element, the deformation being caused by the local compaction on account of forces acting parallel to the surface.

The disclosure is based on the insight that in the case of a local compaction in the material of the optical element, besides the local surface depression, stresses are also induced in the body of the optical element, which stresses can lead to deformations of the surface far beyond the local region of the compaction. The determination according to the disclosure of the predefinition for the locally resolved energy dose distribution via an optimization calculation taking account of a deformation of the optical element which is caused on account of forces acting parallel to the surface makes it possible to realize the predefined desired change of the surface shape of the optical element with a considerably improved accuracy.

In other words, the determination of the locally resolved energy dose distribution is carried out by solving an optimization problem. In this case, the surface change dependent on a locally resolved energy dose is calculated and adapted to a predefined desired change. The optimization uses the desired change as input and outputs as the result an optimum locally resolved energy dose distribution for achieving the desired change. In this case, the value of a merit function, also referred to as target function, is maximized by varying a variable or an argument of the merit function.

The energy dose should be understood to mean the energy per area which is introduced into the optical element via the electron irradiation. A suitable unit for the energy dose is e.g. $J/mm^2$. The locally resolved energy dose distribution mentioned should be understood to mean a distribution $e(x,y)$ of the introduced energy per area as a function of the surface coordinates x, y of the surface of the optical element.

The area element can be for example an area section of the surface of the optical element which is impinged on by a uniform energy dose during the irradiation by the electron irradiation unit. In this regard, the area element can have for example the extent of the cross section of the electron beam radiated onto the surface by the electron irradiation unit.

As mentioned, the conversion term takes into account not only the depression of the surface of the optical element that is caused by the local compaction and takes place directly in the region of the compaction, but also a deformation of at least one section of the surface which is larger by a multiple compared with the region affected by the direct depression, in particular a deformation of the entire surface of the optical element. This deformation is due to the fact that a compaction initiated by the electron irradiation describes a material densification in all spatial directions. The material densification in directions extending parallel to the surface generates stresses in the optical element which then lead to the deformation mentioned.

The conversion term can be in particular a linear operator A, which is also referred to hereinafter as compaction sensitivity operator. In this case, the following linear relationship is assumed between the resulting shape change $h(x,y)$ of the entire surface and a locally resolved compaction $g(x,y)$:

$$Ag=h$$

With this relationship and the desired change b of the surface shape, the following expression, for example, can be used as merit function:

$$\|Ag-b\|^2$$

The optimization problem then results by way of example as:

$$\|Ag-B\|^2 \rightarrow \min$$

On the basis of the predefinition $e(x,y)$ of the energy dose distribution as determined by the control unit, it is possible to determine for example the respective residence time of the electron beam radiated onto the surface of the optical element via the electron irradiation unit at the individual locations of the surface. Alternatively, it is also possible to determine the intensity of an intensity-controlled electron beam for individual locations of the surface. The intensity describes the number of electrons incident on an area element per unit time.

In accordance with one embodiment according to the disclosure, the local compaction is described in the merit function as a function of the energy dose distribution and the control unit is configured to vary the energy dose distribution for the purpose of optimization of the merit function. Consequently, in this case, the energy dose distribution is that variable of the merit function on which the optimization is based. In this case, according to one exemplary embodiment, the compaction $g(x,y)$ is described in the merit function as a function of the energy dose distribution $e(x,y)$ as follows:

$$g(x,y)=c_{cp}e^{\alpha(x,y)}$$

In this case, the parameters $c_{cp}$ and $\alpha$ are constants which are dependent on the electron energy, the layer composition and the layer thicknesses of the optical element. This relationship between the compaction $g(x,y)$ and the energy dose distribution $e(x,y)$ can be implemented in a simple manner computationally.

In accordance with a further embodiment according to the disclosure, the local compaction is described in the merit function via a power series expansion in which the energy dose distribution functions in at least two different powers as a basis system. The local compaction $g(x,y)$ can also be represented as a function of the energy dose distribution $e(x,y)$ and with the expansion coefficients $a_i$ as follows:

$$g(e)=a_1e+a_2e^2+a_3e^3+\ldots+a_Me^M$$

In particular, in one preferred embodiment, the local compaction $g(x,y)$ is described as follows:

$$g=a_1e+a_2e^2$$

wherein e is the energy dose distribution and $a_1$ and $a_2$ are expansion coefficients of the power series expansion. The use of a power series expansion or of a polynomial makes it possible to achieve, depending on the number of powers used, a desired accuracy of the description of the local compaction $g(x,y)$ by the energy dose distribution $e(x,y)$.

In one embodiment according to the disclosure, the control unit is configured to vary the local compaction for the purpose of optimization of the value of the merit function. The local compaction is thus that variable of the merit function on which the optimization is based. In this case, the local compaction can be described for example in the form of the locally resolved compaction $g(x,y)$ mentioned above.

In accordance with one embodiment according to the disclosure, the conversion term is an integral operator. The linear relationship Ag=h already described further above can be assumed between the resulting shape change $h(x,y)$ and a locally resolved compaction $g(x,y)$. The following thus holds true in this exemplary embodiment:

$$h(x,y)=\int_{\tilde{\Omega}} A(x,y,x',y')g(x',y')dx'dy'$$

wherein $A(x, y, x', y')$ is the integral kernel associated with the linear operator A and $\tilde{\Omega} \subset \mathbb{R}^2$ is the irradiated area.

In accordance with one embodiment, the control unit includes a determining unit configured to determine the conversion term via the finite elements method. The finite elements method (FEM) is a numerical method for solving partial differential equations that is known to the person skilled in the art. The FEM can be used in the case of solids for calculating deformations as a result of energy input. The effects of a plurality of local compactions at different locations of the surface on the shape of the entire surface and thus the corresponding conversion term can also be determined via FEM.

In a further embodiment, the determining unit is configured to determine the conversion term taking account of the geometry of the optical element and/or of a location of use of the optical element in an optical arrangement. The geometry, the location of use or both variables are thus input variables for the determining unit. In particular, the shape of the optically effective area, the shape of the edge around the optically effective area or else the entire three-dimensional shape of the optical element can be taken into account. Furthermore, rigid body degrees of freedom of the optical element that are dependent in each case on a location of use can influence the determination of the conversion term. The optical arrangement with regard to which a location of use is taken into account can be e.g. an optical system of a projection exposure apparatus for lithography, in particular a projection lens of such an exposure apparatus.

Furthermore, in one embodiment according to the disclosure, the determining unit is configured to carry out the determination of the conversion term on the basis of a compaction distribution describing the compaction in a locally resolved manner over the surface of the optical element. In this case, the compaction distribution is represented via a polynomial basis. In particular, Chebyshev polynomials can serve as a basis system for representing the compaction distribution. A basis function system composed of Chebyshev polynomials is particularly suitable for approximately rectangular surfaces. Alternatively, it is also possible to use B splines (basis splines) as basis functions for representing the compaction distribution.

In accordance with a further embodiment, the device includes a determining unit configured to determine the conversion term by ascertaining the resulting change of shape of the surface of the optical element on the basis of a compaction distribution describing the compaction in a locally resolved manner over the surface of the optical element, the compaction distribution being represented via a polynomial basis, and ascertaining a linear operator as the conversion term from the resulting change of shape. The resulting change of shape can be the variable referred to below in this text as resulting total change $h(x,y)$, the compaction distribution can be the variable $g(x,y)$, the polynomial basis can be the Chebyshev polynomials $T_{nm}(x, y)$ or the combinations $\Psi T_{nm}$ including Chebyshev polynomials $T_{nm}(x,y)$ and a cut-off function $\Psi$, and the linear operator can be the variable A.

In one aspect, the disclosure provides a method for changing a shape of a surface of an optical element via electron irradiation. The method includes determining a predefinition for a locally resolved energy dose distribution for the electron irradiation from a predefined desired change of a surface shape of the optical element by optimization via a minimization of a merit function, in such a way that a difference between the desired change and an actual change of the surface shape of the optical element, the actual change being brought about on account of the predefinition determined, is minimized. The merit function contains a conversion term for converting a local compaction into a resulting change of shape of the surface of the optical element, wherein the local compaction describes a material densification produced by electron irradiation in the region of an area element of the surface. In this case, the conversion term is configured to take into account both a surface depression caused by the local compaction in the region of the area element and a deformation of at least one section of the surface whose area is a multiple of the area of the area element, the deformation being caused by the local compaction on account of forces acting parallel to the surface. Furthermore, the method includes radiating electrons onto the surface of the optical element with a locally resolved energy dose distribution corresponding to the predefinition determined, for the purpose of producing the local compaction in the optical element.

Analogously to the device according to the disclosure, the conversion term in the merit function takes into account not only the local surface depression caused by the local compaction but also a deformation of a partial section of the surface or of the entire surface, the deformation being brought about by stresses. By virtue of this measure, a locally resolved energy dose distribution with which a highly accurate change of the surface by electron irradiation is made possible is determined with an optimization via the merit function.

In accordance with one embodiment according to the disclosure, the local compaction is described in the merit function as a function of the energy dose distribution, and the energy dose distribution is varied during the optimization via the merit function.

In accordance with a further embodiment, the local compaction is varied during the optimization via the merit function. In a further embodiment according to the disclosure, the conversion term is determined via the finite elements method.

In accordance with one embodiment, a compaction distribution representing the compaction in a locally resolved manner over the surface of the optical element is represented via a polynomial basis, and the conversion term is determined on the basis of the compaction distribution represented via the polynomial basis. By way of example, a basis function system composed of Chebyshev polynomials or B splines (basis splines) can be used as a polynomial basis for representing the compaction distribution or the locally resolved local compaction.

In accordance with a further embodiment, the conversion term is determined as follows: representing, via a polynomial basis, a compaction distribution describing the compaction in a locally resolved manner over the surface of the optical element, ascertaining the resulting change of shape of the surface of the optical element on the basis of the compaction distribution represented via the polynomial basis, and ascertaining a linear operator as the conversion term from the resulting change of shape.

In one embodiment according to the disclosure, the optical element is part of a projection lens for microlithography. In particular, the optical element can be designed as a lens element or as a mirror. In a further embodiment, the optical element is part of an illumination system of a projection exposure apparatus for microlithography. Furthermore, the optical element can also have diffractive structures.

In accordance with one embodiment, the optical element is a mirror for reflecting extreme ultraviolet radiation. The mirror is thus designed for reflecting electromagnetic radiation having a wavelength of less than 100 nm, in particular a wavelength of approximately 13.5 nm or approximately 6.7 nm. To that end, the mirror is provided with a correspondingly configured reflective coating. In accordance with this embodiment, a change of the surface shape can be performed both on the completed mirror or on a substrate provided temporarily with a conductive coating and makes it possible to change the surface shape with an accuracy that is sufficient for the EUV range.

Furthermore, a projection lens for microlithography is provided according to the disclosure. The projection lens includes at least one optical element that has been produced via one of the above-described exemplary embodiments of the method according to the disclosure or of the device according to the disclosure. In particular, the at least one optical element can be a mirror for reflecting extreme ultraviolet radiation. The projection lens can thus be designed for use in EUV microlithography. Likewise, an illumination system for a projection exposure apparatus for microlithography can also be provided. In this case, the illumination system includes at least one optical element that has been produced via one of the above-described exemplary embodiments of the method according to the disclosure or of the device according to the disclosure.

Furthermore, an inspection unit for inspecting a substrate for microlithography is provided according to the disclosure. The substrate can be a reticle or a wafer. Accordingly, the inspection unit can thus be configured as a reticle inspection unit or as a wafer inspection unit. The inspection unit includes at least one optical element that has been produced via one of the above-described exemplary embodiments of the method according to the disclosure or of the device according to the disclosure. The optical element produced in this way can be, in particular, part of an imaging lens of the inspection unit.

The features specified with respect to the aforementioned embodiments, exemplary embodiments or embodiment variants, etc., of the device according to the disclosure can be correspondingly applied to the method according to the disclosure, and vice versa. These and other features of the embodiments according to the disclosure are explained in the description of the figures and in the claims. The individual features can be implemented, either separately or in combination, as embodiments of the disclosure. Furthermore, they can describe advantageous embodiments which are independently protectable and protection for which is claimed if appropriate only during or after pendency of the application.

BRIEF DESCRIPTION OF THE DRAWINGS

The above and further advantageous features of the disclosure are illustrated in the following detailed description of exemplary embodiments according to the disclosure with reference to the accompanying schematic drawings. In the figures.

DETAILED DESCRIPTION OF EXEMPLARY EMBODIMENTS ACCORDING TO THE DISCLOSURE

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the disclosure.

Figure 1:
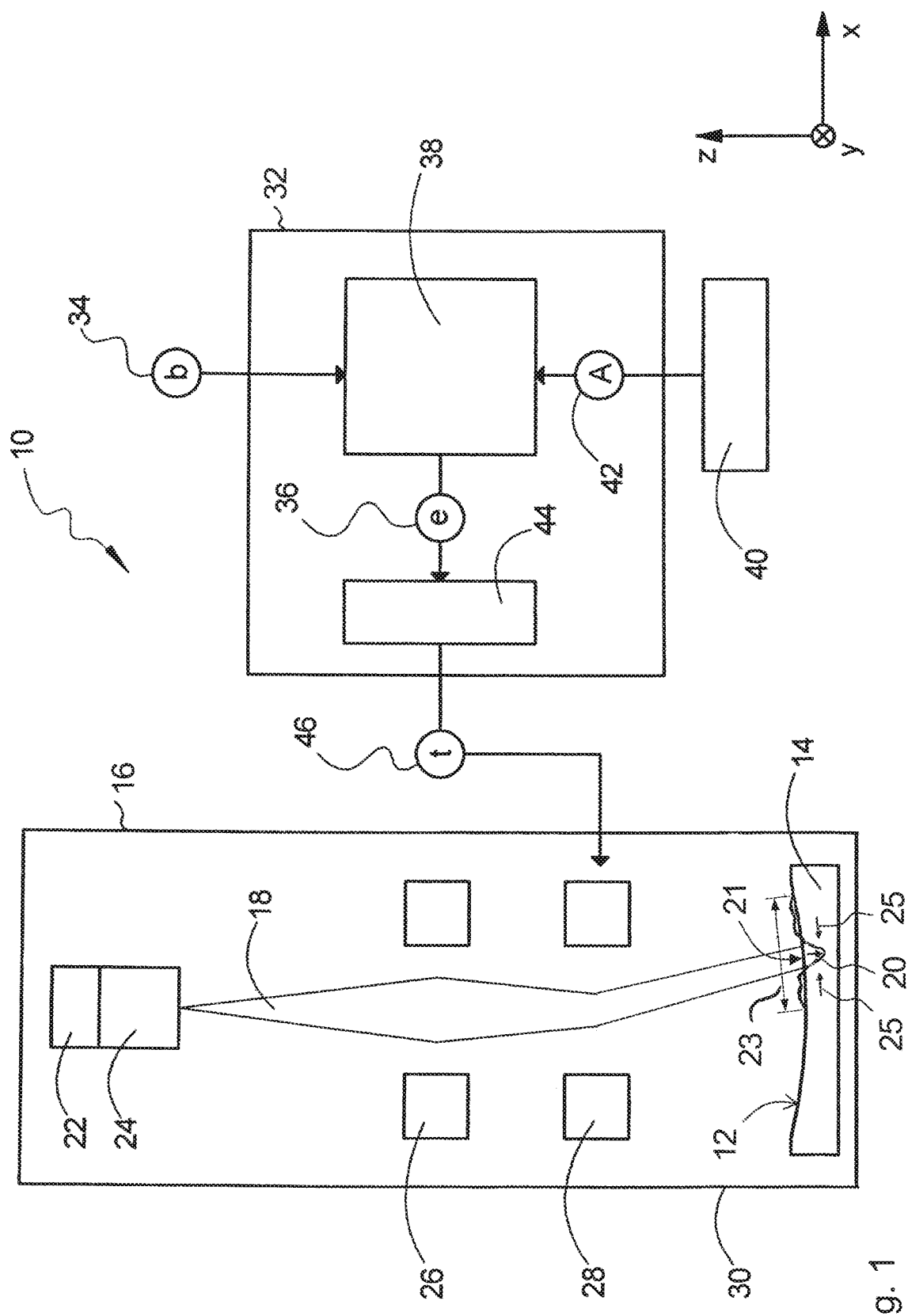
FIG. 1 shows one exemplary embodiment of the device according to the disclosure for changing a shape of a surface of an optical element via electron irradiation in a schematic illustration.

In order to facilitate the description, a Cartesian xyz-coordinate system is indicated in the drawing, from which system the respective positional relationship of the components illustrated in the figures is evident. In FIG. 1, the y-direction extends perpendicularly to the plane of the drawing into the plane, the x-direction extends toward the right, and the z-direction extends upward.

Components and functionings of exemplary embodiments of the device according to the disclosure together with corresponding exemplary embodiments of the method according to the disclosure are described below.

FIG. 1 schematically illustrates one exemplary embodiment of a device 10 for changing a shape of a surface 12 of an optical element 14 via electron irradiation. By way of example, a mirror for the EUV wavelength range, i.e. for electromagnetic radiation having a wavelength of less than 100 nm, in particular a wavelength of approximately 13.5 nm or approximately 6.7 nm, is provided as optical element 14. This can be a mirror for a projection lens or for a mask illumination system of a projection exposure apparatus for EUV microlithography, as illustrated below with reference to FIG. 3. However, the device 10 is also suitable for highly accurate surface shape production or surface shape change for other optical elements, such as, for example, mirrors for other wavelength ranges, lens elements or optical elements having diffractive structures.

The device 10 contains an electron irradiation unit 16 for generating an electron beam 18 that is directed and focused onto selectable locations of the surface 12. The electron beam 18 is configured energetically in particular in such a way that a more or less greatly pronounced local compaction of the material of the optical element 14 in the vicinity of the surface 12 is brought about depending on the energy dose. Energy dose should be understood to mean the energy per area which is introduced into the optical element 14 by the electron beam 18. The energy dose is thus dependent in particular on the residence duration of the electron beam at the selected location and on the intensity of the electron beam.

The local compaction brings about a local surface depression 20 in the region of an area element 21. The surface depression 20 is depicted in a greatly exaggerated manner in FIG. 1 for illustration purposes. A compaction occurs as a result of a redistribution of electron bonds in particular in amorphous materials. In this case, the local compaction is effected in all spatial directions, that is to say that not only a local surface depression 20 in the region of the area element 21 in the negative z-direction but also a compaction parallel to the surface 12, that is to say approximately along the x/y-plane, take place. In this case, forces 25 acting parallel to the surface 12 arise, as a result of which stresses are induced in the optical element 14. The stresses can bring about a deformation of a surface section 23 that is significantly larger than the area element 21 affected by the local compaction. The surface section 23 can include a part of the surface 12 or else the entire surface 12.

In order to generate the electron beam 18, the electron irradiation unit 16 contains an electron source 22 and an acceleration unit 24. By way of example, an incandescent cathode, a crystal cathode or a field emission cathode can be used as the electron source 22. The acceleration unit 24 accelerates and focuses the electrons emitted by the electron source 22. To that end, the acceleration unit 24 can have an anode having a high positive electrostatic potential relative to the electron source 22 and having a small exit opening for the accelerated electrons. For focusing and for setting the intensity of the electron beam 18, the acceleration unit 24 furthermore contains a control electrode, for example a Wehnelt cylinder. The intensity or the beam current indicates the number of electrons which pass through an imaginary area perpendicular to the electron beam per unit time.

For focusing the electron beam 18 coming from the acceleration unit 24, the electron irradiation unit 16 furthermore includes a focusing unit 26 having suitably configured electrical or magnetic components.

The electron beam 18 can be deflected both in the x-direction and in the y-direction by a deflection unit 28 of the electron irradiation unit 16. For this purpose, the deflection unit 28 likewise contains suitably configured electrical or magnetic components. Depending on the setting of the deflection unit 28, the electron beam 18 impinges on the surface 12 of the optical element 14 at a specific location (x,y). In this way, a multiplicity of different locations of the surface 12 can be irradiated successively and a locally resolved energy dose distribution over the surface 12 can thus be achieved. The locally resolved energy dose distribution should be understood here to mean a distribution of the introduced energy e(x,y) per area as a function of the surface coordinates x, y of the surface 12 of the optical element 14. In this case, the irradiation can be carried out for example in a raster-like manner or else continuously over the entire surface. Moreover, an irregular or regular arrangement of different locations to be irradiated, for instance in lines, circles, ellipses or the like, is possible.

In order to avoid absorption of the electrons of the electron beam 18 by air, the electron irradiation unit 16 furthermore has a vacuum chamber 30, in which the electron source 22, the acceleration unit 24, the focusing unit 26, the deflection unit 28 and the optical element 14 or at least the surface 12 of the optical element 14 are arranged.

The device 10 furthermore contains a control unit 32 for controlling the electron irradiation unit 16. The control unit 32 is configured in particular to determine, from a predefined desired change 34 for the surface 12 of the optical element 14, a locally resolved energy dose distribution 36 for the irradiation of the surface 12 with the electron beam 18, with which the desired change 34 is achieved very accurately.

For this purpose, the control unit 32 contains an optimization module 38 for optimizing the value of a merit function. Furthermore, the device 10 contains a determining unit 40 for determining a conversion term 42. The conversion term 42 is used in the merit function for converting a local compaction into a resulting change of shape of the surface 12 taking into account the local surface depression 20 and also the deformation of the surface 12, the deformation being caused by the forces 25 acting parallel to the surface 12. The construction and the functioning of the optimization module 38 and of the determining unit 40 are explained in greater detail further below.

Furthermore, the control unit 32 includes a conversion module 44. In this exemplary embodiment, the conversion module 44 converts the locally resolved energy dose distribution 36 determined into a locally resolved residence duration 46 of the electron beam 18 for specific surface coordinates x, y. The location-dependent residence duration 46 is subsequently used for correspondingly setting the deflection unit 28. The determined energy dose distribution 36 on the surface 12 and thus a corresponding, highly accurate change of shape of the surface 12 of the optical element 14 are achieved in this way.

In alternative exemplary embodiments, the conversion module 44 generates, instead of or in addition to the residence duration, a locally resolved intensity of the electron beam 18 from the location-dependent energy dose distribution 36 determined. Moreover, additionally or alternatively, a location-dependent setting of the focusing via the focusing unit 26 or of the acceleration or of the kinetic energy of the electrons via the acceleration unit 24 can be effected.

Figure 2:
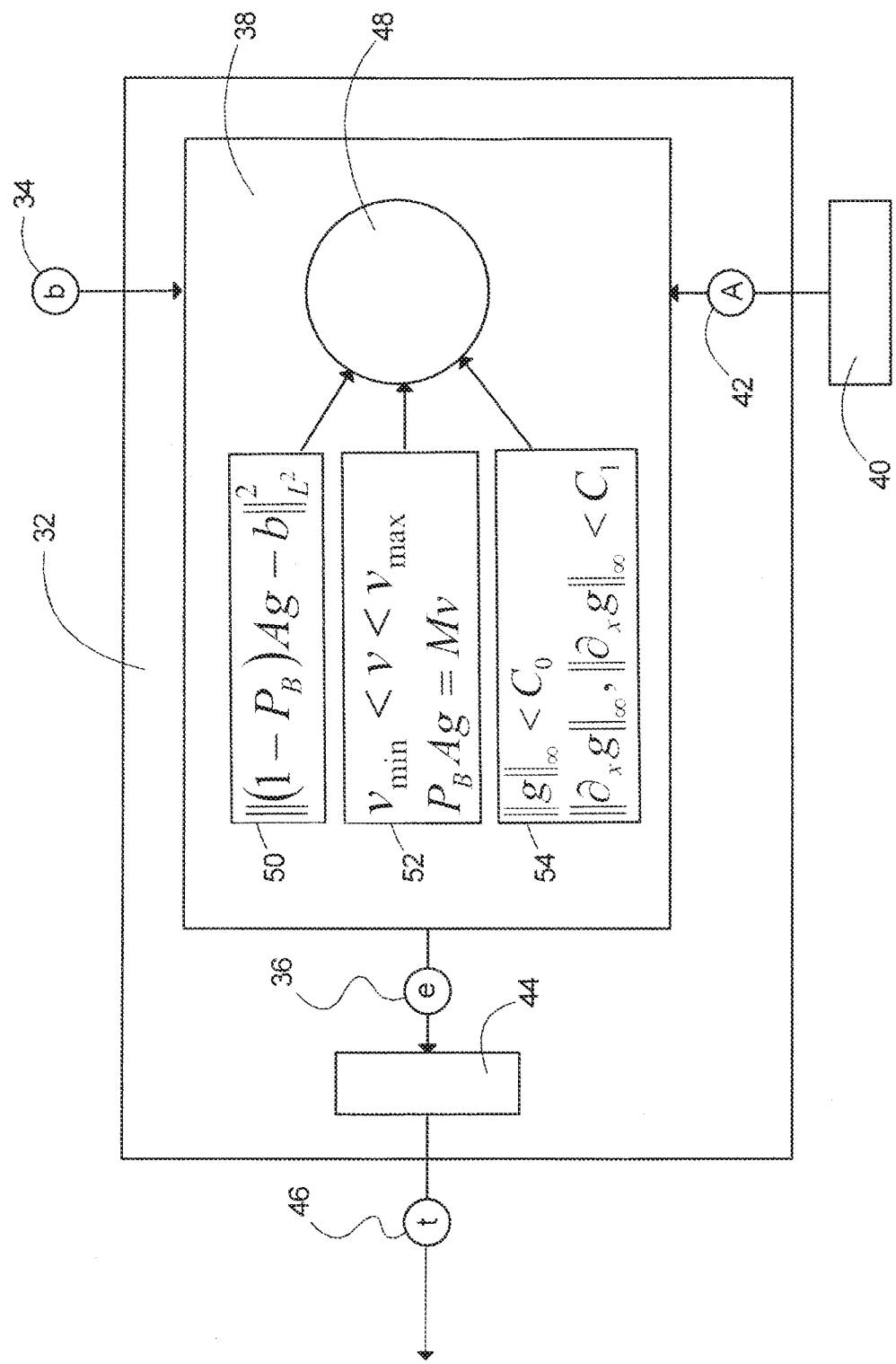
FIG. 2 shows an illustration of the construction and the functioning of a control unit of the device in accordance with FIG. 1.

FIG. 2 illustrates in greater detail the construction and the functioning of the control unit 32 with the optimization module 38. In order to ascertain a suitable locally resolved energy dose distribution 36, described by e(x,y), for a predefined desired change 34 of the surface 12, the desired change being described by b(x,y), the optimization module 38 with an optimization algorithm 48 performs an optimization via a merit function 50, also called target function. In this exemplary embodiment, a location-dependent compaction g(x,y) and thus indirectly a location-dependent energy dose distribution e(x,y) are sought, such that the merit function 50 produces a minimum value. In this case, non-local stress deformations of the surface 12 as a result of local compactions are also taken into account, in particular, with the aid of the conversion term 42.

Several embodiments of a merit function 50 are described below. Since local compactions take place on significantly smaller length scales than the length scales of the surface 12, a linear relationship can be assumed between the compaction g(x,y) and the resulting total change h(x,y) of the surface 12:

$$Ag=h \qquad (1)$$

In this case, the conversion term 42 is designated as a linear operator A. In this exemplary embodiment, the linear operator A is an integral operator:

$$h(x,y)=\int_{\tilde{\Omega}} A(x,y,x',y')g(x',y')dx'dy' \qquad (2)$$

wherein A(x, y, x', y') is the integral kernel associated with the linear operator A and $\tilde{\Omega} \subset \mathbb{R}^2$ is the irradiated area. Owing to the edge trail-off, the irradiated area $\tilde{\Omega}$ is somewhat larger than the footprint or basic area $\Omega$ of the surface 12. In alternative exemplary embodiments, a nonlinear operator A can also be used.

Using equation (1) and a desired change b(x,y) of the shape of the surface 12, one embodiment of the merit function 50 reads:

$$\|Ag-b\|_{L^2}^2 \qquad (3)$$

wherein as norm, use is made of the $L^2$ norm for square-integrable functions on the basic area $\Omega$ of the surface 12:

$$\|f\|_{L^2}^2 = \int_\Omega f^2(x,y)dxdy \qquad (4)$$

Either the desired surface change or else a wavefront change corresponding to the surface change can be used as the predefined desired change b(x,y). As optimization problem, therefore, an always positive compaction g(x,y)≥0 is sought for a predefined desired change b(x,y), such that $$\|Ag-b\|_{L^2}^2 \to \min \qquad (5)$$

A further embodiment of the merit function 50 takes account of the circumstance that compactions are always positive and a positive defocus is always induced. In order to compensate for this preferred direction of the surface deformation, adjustable rigid body degrees of freedom of the optical element 14 are taken into account in the optimization. The rigid body degrees of freedom are usually dependent on the geometry of the optical element 14 and the location of use thereof within an optical system, such as a projection lens, for instance.

In order to take account of the rigid body degrees of freedom, what is taken as a basis is the Hilbert space of the wavefront changes $\mathcal{H}$ with the scalar product $$\langle f_1, f_2 \rangle = \int_{106} f_1(x,y)f_2(x,y)dxdy \qquad (6)$$

The adjustable wavefront changes or errors that can be eliminated by use of the rigid body degrees of freedom form a subspace $\mathcal{H}_B$ B of $\mathcal{H}$. With a projector $P_B$ onto the subspace $\mathcal{H}_B$, it is possible to take account of the rigid body degrees of freedom in the merit function 50. As optimization problem, a compaction $g(x,y) \geq 0$ is then sought for a predefined desired surface change $b(x,y)$ in the form of a wavefront change, such that $$\|(1-P_B)Ag-b\|_{L^2}^2 \to \min \quad (7)$$

wherein $(1-P_B)$ is the projector complementary to $P_B$ onto the subspace of the wavefront changes or errors that cannot be eliminated by rigid body degrees of freedom. A calculation of $P_B$ using a suitable basis and taking account of the geometry and the location of use of the optical element 14 is carried out for example by the determining unit 40. This is explained in greater detail further below.

In one configuration of the optimization problem, travel limitations with respect to the rigid body degrees of freedom are additionally taken into account via a constraint 52. Travels v are elements of a vector space V. An effect of the travels v in the space of the wavefront changes is described by a sensitivity matrix M. Consequently, it holds true as a constraint that for at least one solution of the system $$P_B Ag = Mv \quad (8)$$

$v_{min} < v < v_{max}$ holds true, wherein $v_{min}$ and $v_{max}$ represent travel limits.

In a further configuration of the optimization problem, the maximum compaction and the gradients thereof are restricted by a constraint 54:

$$\|g\|_\infty < C_0, \|\partial_x g\|_\infty, \|\partial_x g\|_\infty < C_1 \quad (9)$$

In accordance with one exemplary embodiment, therefore, as optimization problem, a compaction $g(x,y) \geq 0$ is sought for a desired surface change $b(x,y)$ in the form of a wavefront change, such that $$\|(1-P_B)Ag-b\|_{L^2}^2 \to \min \quad (10)$$

the manipulator travel represents $v_{min} < v < v_{max}$ for at least one solution of the system $$P_B Ag = Mv \quad (11)$$

and the maximum norm of $g(x,y)$ and the derivatives thereof are limited as follows:

$$\|g\|_\infty < C_0, \|\partial_x g\|_\infty, \|\partial_x g\|_\infty < C_1 \quad (12)$$

In the exemplary embodiments described above, the locally resolved compaction $g(x,y)$ is varied in order to optimize the value of the merit function 50. An optimum locally resolved compaction $g(x,y)$ is thus present as the result. From the compaction $g(x,y)$ determined, by way of example, using the equation $$g(x,y) = c_{cp} e^{\alpha(x,y)} \quad (13)$$

it is possible to determine the associated locally resolved energy dose distribution $e(x,y)$. In this case, the parameters $c_{cp}$ and $\alpha$ are constants that are dependent on the electron energy, the layer composition and the layer thicknesses of the optical element. This relationship between the compaction $g(x,y)$ and the energy dose distribution $e(x,y)$ can be implemented, in an uncomplicated manner computationally.

Alternatively, for determining the energy dose distribution $e(x,y)$ from the local compaction $g(x,y)$, it is also possible to use a power series expansion or a polynomial on the basis of the energy dose distribution:

$$g(e) = a_1 e + a_2 e^2 + a_3 e^3 + \ldots + a_M e^M \quad (14)$$

wherein $a_i$ are expansion coefficients. Preferably, at least two different powers of the energy dose distribution are used in this case. In particular, in one preferred exemplary embodiment, for simplifying the optimization, the local compaction $g(x,y)$ is described as a function of the energy dose distribution $e(x,y)$ as follows:

$$g = a_1 e + a_2 e^2 \quad (15)$$

In other exemplary embodiments, the local compaction $g(x,y)$ in the merit function 50 is replaced by the energy dose distribution $e(x,y)$. By way of example, one of the equations (13), (14) or (15) can be used for this purpose. In one optimization, the energy dose distribution $e(x,y)$ is varied instead of the compaction $g(x,y)$. A corresponding adaptation of the constraints 52 and 54 is performed for this purpose.

Instead of the above-described deterministic functional relationships between the compaction $g(x,y)$ and the energy dose distribution $e(x,y)$, a stochastic approach can also be used. The functional relationship in return additionally has random fluctuations. An optimization can then be carried out for example for the expected value and the variance of the merit function.

For determining the conversion term 42 or the linear operator A, one embodiment involves firstly determining suitable basis function systems for the local compaction $g(x,y)$ and the predefined wavefront change or desired change $b(x,y)$. A selection of a suitable function space with a basis function system for the locally resolved compaction $g(x,y)$, also called compaction distribution hereinafter, can be carried out for example by the determining unit 40 taking account of the geometry of the optical element 14. In this regard, e.g. for an approximately rectangular surface 12, a function set consisting of Chebyshev polynomials can be selected as a basis:

$$T_{nm}(x,y) = T_n(x) T_m(y) \quad (16)$$

The definition scope for the functions $T_{nm}$ is extended here to encompass the irradiated area $\tilde{\Omega}$. In addition, each basis function $T_{nm}$ is multiplied by a cut-off function $\Psi$ which has the value 1 on the surface 12 and tends toward zero at the edge of the irradiated area $\tilde{\Omega}$. What is achieved in this way is that the compaction that is representable by the basis system also disappears at the edge. The compaction distribution $g(x,y)$ can then be represented as a linear combination of the functions $\Psi T_{nm}$. A further alternative function set may be B splines, for example.

By way of example, an orthonormal system constructed from linear combinations of Zernike polynomials is selected as a basis for the predefined desired surface change $b(x,y)$ in the shape of a wavefront change in Hilbert space $\mathcal{H}$.

With the aid of the basis systems for the compaction distribution $g(x,y)$ and the predefined wavefront change $b(x,y)$, the conversion term 42 or the linear operator A can be described by a matrix. To that end, the determining unit 40 firstly determines in each case a resulting total change $h(x,y)$ of the surface 12 via a finite elements calculation for the basis functions $\Psi T_{nm}$ of the compaction distribution $g(x,h)$. With the result of the finite elements calculation, the determining unit 40 determines the conversion term 42 taking account of the rigid body degrees of freedom, the geometry and the location of use of the optical element 14. In this case, firstly the projector $P_B$ can be ascertained. The conversion term 42 determined is subsequently transferred to the optimization module 38 of the control unit 32 and used during an optimization in the merit function 50.

For changing the shape of the surface 12, firstly the wavefront change in the form of the desired surface change b(x,y) 34 is transferred to the control unit 32. In this case, the desired surface change, as described above, can be represented as linear combinations of Zernike polynomials. The desired surface change 34 may have been ascertained beforehand via a measurement of the surface 12. By way of example, a phase shift method or some other method known to the person skilled in the art can be employed for this purpose.

With the desired surface change 34 as input, the optimization module 38 implements the optimization algorithm 48. In this case, the merit function 50 is minimized with the conversion term 42 already having been ascertained beforehand, taking account of the constraints 52 and 54. A suitable locally resolved energy dose distribution 36 for the desired change is determined as the result or output of the optimization. The energy dose distribution 36 determined is subsequently converted, by the conversion module 44, into a location-dependent residence duration 46 of the electron beam 18 for different locations of the surface 12. The location-dependent residence duration 46 is finally used by the control unit 32 for controlling the electron irradiation unit 16. Alternatively, a location-dependent intensity of the electron beam 18 can also be predefined.

The electron irradiation of the surface 12 that is carried out in this way brings about a compaction distribution which achieves highly accurately the desired change 34 wanted via local surface depressions 20 and deformations of the surface by stress forces parallel to the surface 12. Since, during the actual optimization by the optimization module 38, no FEM is carried out for ascertaining a resulting total change from local compactions, a change of shape is able to be carried out rapidly even for a plurality of optical elements. The device 10 is suitable in particular for the highly accurate processing of mirrors for projection lenses or other optical systems in EUV microlithography.

Figure 3:
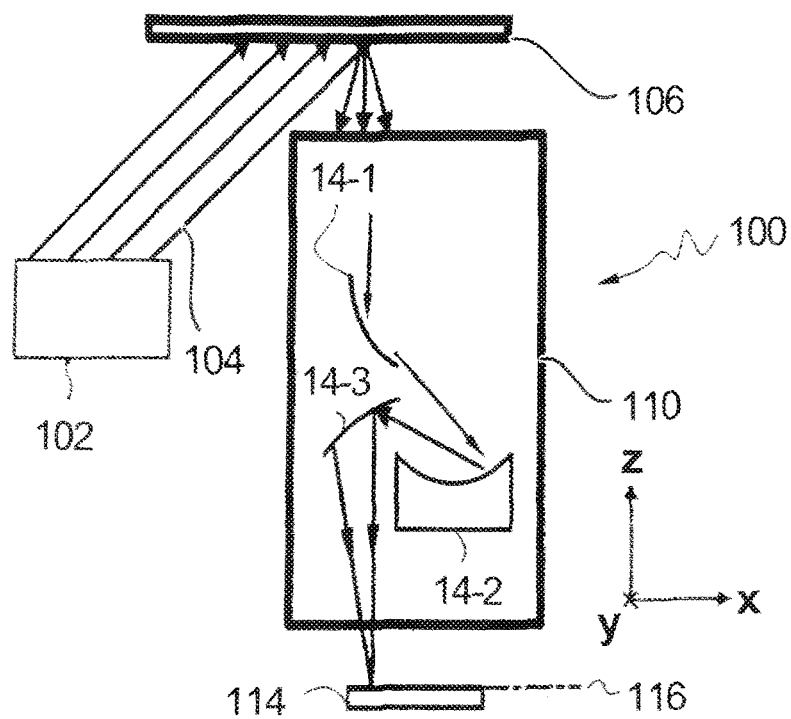
FIG. 3 shows a projection exposure apparatus for microlithography including a projection lens including an optical element produced via the device in accordance with FIG. 1.

FIG. 3 shows a schematic sectional view of a projection exposure apparatus 100 for microlithography including a projection lens 110 including at least one optical element 14 in the form of a mirror 14-1, 14-2 or 14-3, the optical element having been produced using the device 10 according to the disclosure for changing the surface shape in one of the embodiments above.

The projection exposure apparatus 10 includes an illumination system 102 for producing exposure radiation 104 in the form of EUV radiation (extreme ultraviolet radiation) having a wavelength of <100 nm, in particular a wavelength of approximately 13.5 nm or approximately 6.8 nm. In other variants (not illustrated in a drawing), the exposure radiation 104 can be what is known as DUV radiation, i.e. radiation in the deep UV wavelength range having a wavelength of e.g. 248 nm or 193 nm.

The exposure radiation 104 is incident on a lithography mask 106 with mask structures to be imaged that are arranged thereon. Here, the exposure radiation 104 may be reflected, as shown in FIG. 10, at the lithography mask 106, as is often the case when using EUV radiation. Alternatively, the lithography mask 106 may also be configured as a transmission mask. In this case, the exposure radiation 104 passes through the mask 106.

Imaging the mask structures onto a wafer 114 arranged in an image plane 116 is effected using the projection lens 110, which includes a multiplicity of mirrors, of which FIG. 3 illustrates by way of example three mirrors, specifically the mirrors 14-1, 14-2 and 14-3.

Figure 4:
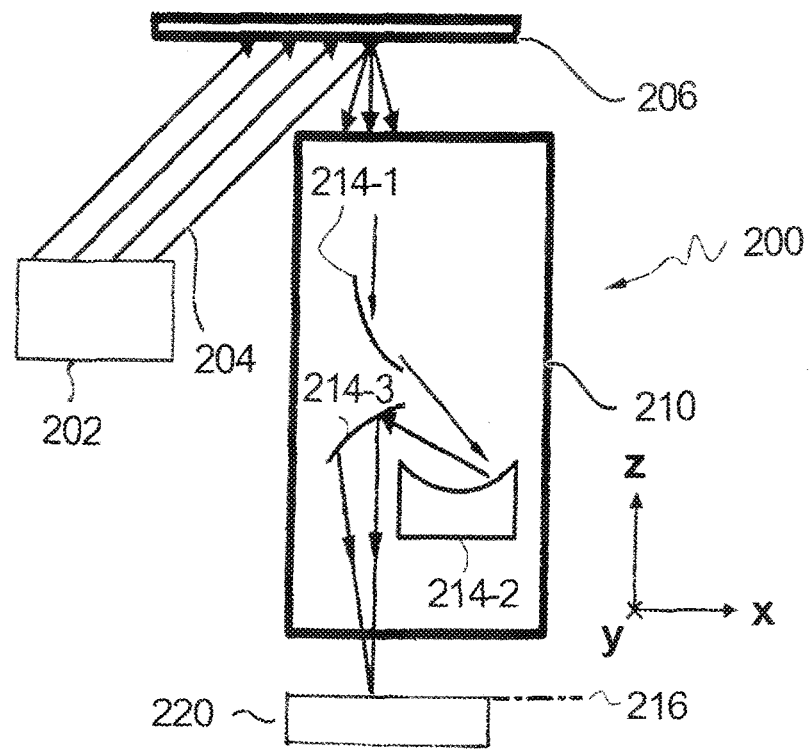
FIG. 4 shows an inspection unit for inspecting a substrate for microlithography, the substrate including an optical element produced via the device in accordance with FIG. 1.

FIG. 4 shows a schematic sectional view of an inspection unit 200 for inspecting a substrate for microlithography. The substrate to be inspected may be a lithography reticle or a wafer. In the first case, the inspection unit 200 is a reticle inspection unit, and in the second case a wafer inspection unit.

The inspection unit 200 includes an imaging lens 210 including at least one optical element 14 in the form of a mirror 214-1, 214-2 or 214-3, the optical element having been produced using the device 10 according to the disclosure for changing the surface shape in one of the embodiments above.

The inspection unit 200 includes an illumination system 202 for producing inspection radiation 204 in the form of EUV radiation (extreme ultraviolet radiation) having a wavelength of <100 nm, in particular a wavelength of approximately 13.5 nm or approximately 6.8 nm. In other variants (not illustrated in a drawing), the inspection radiation 204 can be what is known as DUV radiation, i.e. radiation in the deep UV wavelength range having a wavelength of e.g. 248 nm or 193 nm, or radiation in the visible wavelength range. In the case where the inspection unit 200 is embodied as a reticle inspection unit, the wavelength of the inspection radiation 204 corresponds to that wavelength for which the reticle to be inspected is configured for use in a projection exposure apparatus.

The inspection radiation 204 is incident on the test substrate 206 to be inspected, which, as mentioned above, depending on the embodiment of the inspection unit 200, can be a lithography reticle with mask structures to be imaged that are arranged thereon, or a wafer. Here, the inspection radiation 204 may be reflected, as shown in FIG. 4, at the test substrate 206, as is often the case when using EUV radiation. Alternatively, in the case of a reticle inspection unit, radiation can also be transmitted through the test substrate 26 in the form of a reticle.

During the inspection, at a respective point in time a section of the test substrate 206 that is irradiated by the inspection radiation 204 is imaged, via the imaging lens 210, onto a detector 220 arranged in the image plane 216 of the imaging lens 210. For the purpose of inspecting the entire surface of the test substrate 206, the latter is displaced step by step transversely with respect to the optical axis of the imaging lens 210. The imaging lens 210 includes a multiplicity of mirrors, of which FIG. 4 illustrates by way of example three mirrors, namely the mirrors 214-1, 214-2 and 214-3.

The above description of exemplary embodiments is to be understood to be by way of example. The disclosure effected thereby firstly enables the person skilled in the art to understand the present disclosure and the advantages associated therewith, and secondly encompasses alterations and modifications of the described structures and methods that are also obvious in the understanding of the person skilled in the art. Therefore, all such alterations and modifications, insofar as they fall within the scope of the disclosure in accordance with the definition in the accompanying claims, and equivalents are intended to be covered by the protection of the claims.

The disclosure encompasses the aspects described in the following clauses. These clauses form part of the description and are not claims:

Clause 1: A device (10) for changing a shape of a surface (12) of an optical element (14) via electron irradiation, including:

an electron irradiation unit (16) configured to radiate electrons onto the surface (12) with a locally resolved energy dose distribution (36) for the purpose of producing local material densifications in the optical element (14), and a control unit (32) configured to determine, from a predefined desired change (34) of a surface shape of the optical element (14), a predefinition for the locally resolved energy dose distribution (36) for controlling the electron irradiation unit (16) by optimization via a minimization of a merit function (50) in such a way that a difference between the desired change and an actual change of the surface shape of the optical element, the actual change being brought about on account of the predefinition determined, is minimized, wherein the merit function (50) contains a conversion term (42) for converting a local compaction, which describes a material densification in the region of an area element (21) of the surface (12), into a resulting change of shape of the surface (12) of the optical element (14), and wherein the conversion term (42) is configured to take into account both a surface depression (20) caused by the local compaction in the region of the area element and a deformation of at least one section (23) of the surface (12) whose area is a multiple of the area of the area element (21), the deformation being caused by the local compaction on account of forces acting parallel to the surface (12).

Clause 2: The device according to clause 1, wherein the local compaction is described in the merit function (50) as a function of the energy dose distribution (36) and the control unit (32) is configured to vary the energy dose distribution (36) for the purpose of optimization via the merit function (50).

Clause 3: The device according to any of the preceding clauses, wherein the local compaction is described in the merit function (50) via a power series expansion in which the energy dose distribution (36) functions in at least two different powers as a basis system.

Clause 4: The device according to clause 1, wherein the control unit (32) is configured to vary the local compaction for the purpose of optimization via the merit function (50).

Clause 5: The device according to any of the preceding clauses, wherein the conversion term (42) is an integral operator.

Clause 6: The device according to any of the preceding clauses, which furthermore includes a determining unit (40) configured to determine the conversion term (42) via the finite elements method.

Clause 7: The device according to clause 6, wherein the determining unit (40) is configured to determine the conversion term (42) taking account of the geometry of the optical element (14) and/or of a location of use of the optical element (14) in an optical arrangement.

Clause 8: The device according to clause 6 or 7, wherein the determining unit (40) is configured to carry out the determination of the conversion term (42) on the basis of a compaction distribution describing the compaction in a locally resolved manner over the surface (12) of the optical element (14), wherein the compaction distribution is represented via a polynomial basis.

Clause 9: The device according to any of the preceding clauses, which furthermore includes a determining unit (40) configured to determine the conversion term (42) by:

ascertaining the resulting change of shape of the surface of the optical element on the basis of a compaction distribution describing the compaction in a locally resolved manner over the surface of the optical element, the compaction distribution being represented via a polynomial basis, and ascertaining a linear operator as the conversion term from the resulting change in shape.

Clause 10: A method for changing a shape of a surface (12) of an optical element (14) via electron irradiation, including the following steps:

determining a predefinition for a locally resolved energy dose distribution (36) for the electron irradiation from a predefined desired change (34) of a surface shape of the optical element (14) by optimization via a minimization of a merit function (50), in such a way that a difference between the desired change and an actual change of the surface shape of the optical element, the actual change being brought about on account of the predefinition determined, is minimized, wherein the merit function (50) contains a conversion term (42) for converting a local compaction into a resulting change of shape of the surface (12) of the optical element (14), wherein the local compaction describes a material densification produced by electron irradiation in the region of an area element (21) of the surface (12), and wherein the conversion term (42) is configured to take into account both a surface depression (20) caused by the local compaction in the region of the area element and a deformation of at least one section (23) of the surface (12) whose area is a multiple of the area of the area element (21), the deformation being caused by the local compaction on account of forces acting parallel to the surface (12), and radiating electrons onto the surface (12) of the optical element (14) with a locally resolved energy dose distribution (36) corresponding to the predefinition determined, for the purpose of producing the local compaction in the optical element (14).

Clause 11: The method according to clause 10, wherein the local compaction is described in the merit function (50) as a function of the energy dose distribution (36), and the energy dose distribution (36) is varied during the optimization via the merit function (50).

Clause 12: The method according to clause 10, wherein the local compaction is varied during the optimization via the merit function (50).

Clause 13: The method according to any of clauses 10 to 12, wherein the conversion term (42) is determined via the finite elements method.

Clause 14: The method according to clause 13, wherein a compaction distribution representing the compaction in a locally resolved manner over the surface (12) of the optical element is represented via a polynomial basis, and the conversion term (42) is determined on the basis of the compaction distribution represented via the polynomial basis.

Clause 15: The method according to any of clauses 10 to 13, wherein the conversion term is determined by:

representing, via a polynomial basis, a compaction distribution describing the compaction in a locally resolved manner over the surface of the optical element, ascertaining the resulting change of shape of the surface of the optical element on the basis of the compaction distribution represented via the polynomial basis, and ascertaining a linear operator as the conversion term from the resulting change of shape.

Clause 16: The method according to any of clauses 10 to 15, wherein the optical element (14) is part of a projection lens for microlithography.

Clause 17: The method according to clause 16, wherein the optical element (14) is a mirror for reflecting extreme ultraviolet radiation.

Clause 18: A projection lens (110) for microlithography including an optical element (14-1, 14-2, 14-3) produced via the method according to any of clauses 10 to 17.

Clause 19: An inspection unit (200) for inspecting a substrate for microlithography including an optical element (214-1, 214-2, 214-3) produced via the method according to any of clauses 10 to 17.

LIST OF REFERENCE SIGNS

10 Device for changing a shape of a surface
12 Surface
14 Optical element
14-1, 14-2, 14-3 Mirrors
16 Electron irradiation unit
18 Electron beam
20 Local surface depression
21 Area element
22 Electron source
23 Surface section
24 Acceleration unit
25 Forces acting parallel to the surface
26 Focusing unit
28 Deflection unit
30 Vacuum chamber
32 Control unit
34 Desired change of the surface
36 Locally resolved energy dose distribution
38 Optimization module
40 Determining unit
42 Conversion term
44 Conversion module
46 Locally resolved residence time
48 Optimization algorithm
50 Merit function
52 First constraint
54 Second constraint
100 Projection exposure apparatus
102 Illumination system
104 Exposure radiation
106 Lithography mask
110 Projection lens
114 Wafer
116 Image plane
200 Inspection unit
202 Exposure system
204 Inspection radiation
206 Test substrate
210 Imaging lens
214-1, 214-2, 214-3 Mirrors
216 Image plane
220 Detector

What is claimed is:

1. A method, comprising:
   determining a predefinition for a locally resolved energy dose distribution for the electron irradiation from a predefined desired change of a surface shape of an optical element by optimization via a minimization of a merit function to minimize a difference between the desired change and an actual change of the surface shape of the optical element, the actual change being brought about on account of the determined predefinition,
   wherein:
      the merit function contains a conversion term to convert a local compaction into a resulting change of shape of the surface of the optical element;
      the local compaction describes a material densification produced by electron irradiation in the region of an area element of the surface;
      the conversion term is configured to take into account both a surface depression caused by the local compaction in the region of the area element and a deformation of at least one section of the surface whose area is a multiple of the area of the area element;
      the deformation is caused by the local compaction on account of forces acting parallel to the surface; and
      radiating electrons onto the surface of the optical element with a locally resolved energy dose distribution corresponding to the determined predefinition to produce the local compaction in the optical element.

2. The method of claim 1, further comprising:
   using an electron irradiation unit to radiate the electrons onto the surface of the optical element; and
   using a control unit to determine the predefinition for the locally resolved energy dose distribution.

3. The method of claim 2, further comprising using the control unit to vary the energy dose distribution.

4. The method of claim 2, further comprising using the control unit to vary the local compaction.

5. The method of claim 2, further comprising using a determining unit configured to determine the conversion term.

6. The method of claim 5, further comprising using the determining unit to determine the conversion term taking account of at least one parameter selected from the group consisting of: i) the geometry of the optical element; and ii) a location of use of the optical element in an optical arrangement.

7. The method of claim 6, further comprising using the determining unit to perform the determination of the conversion term on the basis of a compaction distribution describing the compaction in a locally resolved manner over the surface of the optical element, wherein the compaction distribution is represented via a polynomial basis.

8. The method of claim 2, further comprising using a determining unit to determine the conversion term by:
   ascertaining the resulting change of shape of the surface of the optical element on the basis of a compaction distribution describing the compaction in a locally resolved manner over the surface of the optical element, the compaction distribution being represented by a polynomial basis; and
   ascertaining a linear operator as the conversion term from the resulting change in shape.

9. The method of claim 1, wherein the local compaction is described in the merit function as a function of the energy dose distribution, and the energy dose distribution is varied during the optimization via the merit function.

10. The method of claim 1, further comprising varying the local compaction during the optimization via the merit function.

11. The method of claim 10, further comprising determining the conversion term via the finite elements method.

12. The method of claim 11, wherein a compaction distribution representing the compaction in a locally resolved manner over the surface of the optical element is represented via a polynomial basis, and the conversion term is determined on the basis of the compaction distribution represented via the polynomial basis.

13. The method of claim 1, further comprising determining the conversion term by:
representing, by a polynomial basis, a compaction distribution describing the compaction in a locally resolved manner over the surface of the optical element;
ascertaining the resulting change of shape of the surface of the optical element on the basis of the compaction distribution represented via the polynomial basis; and
ascertaining a linear operator as the conversion term from the resulting change of shape.

14. The method of claim 1, further comprising, after radiating the electrons, using the optical element in a microlithography projection lens.

15. The method of claim 1, further comprising, after radiating the electrons, using the optical element in an EUV microlithography projection lens.

16. The method of claim 1, further comprising, after radiating the electrons, using the optical element in a microlithography projection exposure apparatus.

17. The method of claim 1, further comprising, after radiating the electrons, using the optical element to reflect extreme ultraviolet radiation.

18. The method of claim 1, wherein the optical element comprises a mirror.

19. The method of claim 1, further comprising using the optical element in a microlithography process.

20. The method of claim 1, wherein the optical element comprises a mirror, and the method further comprises disposing the optical element in an EUV microlithography apparatus.

* * * * *

UNITED STATES PATENT AND TRADEMARK OFFICE
CERTIFICATE OF CORRECTION

PATENT NO. : 10,551,747 B2
APPLICATION NO. : 16/117851
DATED : February 4, 2020
INVENTOR(S) : Walter Pauls, Florian Ahles and Martin Weiser Page 1 of 1

It is certified that error appears in the above-identified patent and that said Letters Patent is hereby corrected as shown below:

In the Specification

Column 4, Lines 46-47 (approx.), delete "$h(x,y) = \int_{\Omega \subset \Re} A(x,y,x',y') g(x',y') dx' dy'$,"
and insert -- $h(x,y) = \int_{\Omega \subset \Re^2} A(x,y,x',y') g(x',y') dx' dy'$ --;

Column 10, Lines 29-30 (approx.), delete "$h(x,y) = \int_{\Omega \subset \Re} A(x,y,x',y') g(x',y') dx' dy'$,"
and insert -- $h(x,y) = \int_{\Omega \subset \Re^2} A(x,y,x',y') g(x',y') dx' dy'$ --;

Column 10, Lines 66-67 (approx.), delete "$\langle f_1, f_2 \rangle = \int_{106} f_1(x,y) f_2(x,y) dx dy$,"
and insert -- $\langle f_1, f_2 \rangle = \int_{\Omega} f_1(x,y) f_2(x,y) dx dy$ --.

Signed and Sealed this
Second Day of June, 2020

Andrei Iancu
*Director of the United States Patent and Trademark Office*